(12) United States Patent
Lahnor et al.

(10) Patent No.: US 6,893,968 B2
(45) Date of Patent: May 17, 2005

(54) DEFECT-MINIMIZING, TOPOLOGY-INDEPENDENT PLANARIZATION OF PROCESS SURFACES IN SEMICONDUCTOR DEVICES

(75) Inventors: Peter Lahnor, Dresden (DE); Alexander Simpson, Warrenville, IL (US)

(73) Assignee: Infineon Technologies AG, Munich (DE)

( * ) Notice: Subject to any disclaimer, the term of this patent is extended or adjusted under 35 U.S.C. 154(b) by 102 days.

(21) Appl. No.: 10/268,148

(22) Filed: Oct. 10, 2002

(65) Prior Publication Data

US 2003/0190809 A1 Oct. 9, 2003

(30) Foreign Application Priority Data

Oct. 10, 2001 (DE) .......................................... 101 49 916

(51) Int. Cl.[7] .............................................. H01L 21/311
(52) U.S. Cl. ........................ 438/697; 438/493; 438/496; 438/694
(58) Field of Search ................................ 438/493, 496, 438/690–692, 694, 697

(56) References Cited

U.S. PATENT DOCUMENTS

| 5,494,854 | A | | 2/1996 | Jain | 438/427 |
| 5,728,621 | A | | 3/1998 | Zheng et al. | 438/692 |
| 6,090,714 | A | | 7/2000 | Jang et al. | 438/692 |
| 6,146,971 | A | * | 11/2000 | Chen et al. | 438/424 |
| 6,171,962 | B1 | * | 1/2001 | Karlsson et al. | 438/692 |
| 6,225,225 | B1 | * | 5/2001 | Goh et al. | 438/692 |
| 6,423,639 | B1 | * | 7/2002 | Hong | 438/690 |
| 6,569,349 | B1 | * | 5/2003 | Wang et al. | 252/79.1 |
| 2002/0001876 | A1 | * | 1/2002 | Abdelgadir et al. | 438/118 |

FOREIGN PATENT DOCUMENTS

EP   1 068 928 A2   1/2001

OTHER PUBLICATIONS

Schiltz et al., Plasma etch–back planarization coupled to chemical mechanical polishing for sub 0.18 μm shallow trench isolatio technology, *J. Vac. Sci. Technol. A*, 18 (Jul./Aug. 2000) 1313.*

* cited by examiner

*Primary Examiner*—Christian Wilson
(74) *Attorney, Agent, or Firm*—Laurence A. Greenberg; Werner H. Stemer; Gregory L. Mayback

(57) ABSTRACT

A process for planarizing a process layer having structures and has been applied to a working surface of a semiconductor device, includes abrading the process layer down to the working surface using a polishing device. The working surface is planarized, and a defect density in the working surface is minimized and the polishing process is topology-independent.

19 Claims, 3 Drawing Sheets

DEFECT-MINIMIZING, TOPOLOGY-INDEPENDENT PLANARIZATION OF PROCESS SURFACES IN SEMICONDUCTOR DEVICES

BACKGROUND OF THE INVENTION

Field of the Invention

The invention relates to a process for treating a process layer, which has been structured by a relief with recessed and elevated sections and has been applied to a working surface, in a semiconductor device, in which process the process layer is abraded down to the working surface and the working surface is then planarized.

Application of a functional layer of a semiconductor device (referred to below as a wafer) is usually effected, in a simplified representation, by applying a homogenous working layer containing a working material to a planar surface of the wafer. The working layer is structured, a relief with elevated and recessed sections being formed in the working layer, and the recessed sections of the working layer are filled with at least one process material.

Each application, structuring and filling can in turn be broken down into a number of successive build-up and material-removal processes. The surface of the wafer on which a build-up or material-removal process takes place in each case forms a process surface.

Depending on the process used, during the filling of the recessed sections of the working layer the process material is also applied to a greater or lesser extent to the elevated sections of the working layer.

Particularly when deposition processes are being used, a process layer which is in turn structured in the form of a relief and contains the process material is formed on the working layer, recessed sections of the process layer are formed above the recessed sections of the working layer and elevated sections of the process layer are formed above the elevated sections of the working layer.

The relief of the working layer results in a relief of the process layer which differs from that of the working layer, depending on the process used, with regard to a vertical extent (orthogonal to the working surface) and the sharpness of transitions from the recessed sections to the elevated sections.

The vertical extent in the process layer is usually reduced compared to the vertical extent in the working layer. The transitions in the process layer are shallower and/or rounded compared to the transitions in the working layer.

To ensure complete filling of the recessed sections of the working layer, the process material is deposited to above an upper edge of the recessed sections of the working layer. The result is an overfill between the surface of the working layer and a base surface of the recessed sections of the process layer.

Before a further functional layer is applied, the process layer is abraded again down to the upper edge of the working layer and, at the same time, is planarized.

To enable the abrasion of the process layer to end at the upper edge of the working layer, a stop layer containing a material which is able to withstand the material-removing process is applied in sections at least to the surfaces of the elevated sections (also referred to below as structures) of the working layer before the filling of the recessed sections of the working layer. The surfaces of the sections of the stop layer which lie opposite the working layer define a working surface which is uncovered as the material-removing process continues.

The abrasion and planarization are usually effected by a polishing process such as a chemical mechanical polishing (CMP).

The wafer and a polishing device with sections that rest on the process surface are moved with respect to one another in a polishing plane that is parallel to the process surface.

Abrasive particles that are located between the process surface and those sections of the polishing device that rest on the process surface abrade the process layer. The abraded material is discharged by a process liquid.

The abrasive particles are either supplied with the processing liquid (standard slurry polishing process) or released from the polishing device during the polishing process (fixed abrasive (FA) polishing process.

In the FA polishing process, the abrasive particles are embedded in a carrier material on a surface of a polishing cloth or polishing pad (referred to below as polishing cloth for both) that faces the process surface.

The embedded abrasive particles are usually crystals of silicon oxides or cerium oxides with a typical diameter of between 30 and 500 nm.

The carrier material has a toughness with respect to abrasion by the process surface which is high or low and is dependent on its composition.

The process surface has an aggressiveness with respect to the carrier material which is high or low and is dependent on the material which is to be abraded and the relief of the process surface which is to be machined.

The process surface has a high aggressiveness with respect to the carrier material if a number of edge lengths of the process surface are high and the extent of the relief of the process surface in a direction perpendicular to the polishing plane is large. The aggressiveness is furthermore determined by the angles between the edges of the relief and the polishing plane.

The number of edge lengths is the total edge length, based on a reference surface, of the relief within the reference surface. It is high in finely structured regions and low in coarsely structured regions of the process surface.

The number of edge lengths and therefore also the aggressiveness can vary considerably from region to region on a single process surface. Furthermore, it varies from process surface to process surface and is dependent both on the configurations produced on the wafers and on the technologies used to form a configuration, for example the deposition technology used for the process layer.

In the case of FA polishing processes, the toughness of the carrier material and the aggressiveness of the polishing surface determine the number of abrasive particles that are released. The number of abrasive particles released in turn determines the rate at which the process layer is abraded.

For uniform abrasion, coarsely structured process surfaces with a low aggressiveness require soft carrier materials, and finely structured process surfaces with high aggressiveness require a hard carrier material. The polishing process is maintained at least until the layer which is to be abraded has been reliably abraded. This requires an after run, i.e. longer polishing on the stop layer.

If the carrier material is very soft in relation to the aggressiveness of the process surface, abrasive particles are quickly released from the polishing cloth, and abrasion is correspondingly rapid. If the polishing process dwells on the working surface in the after run, sections of the working surface made from a softer material than that of the stop layer will be chipped out by the sections of the polishing cloth resting thereon (dishing). Moreover, the rapid release of abrasive particles results in a relatively high defect density in the working surface.

On the other hand, if the carrier material is hard in relation to the aggressiveness of the process surface, abrasive particles are only released to a reduced extent. The grinding process lasts a disproportionately long time and under certain circumstances may stop prematurely, i.e. before the stop layer is reached.

An optimum procedure in the FA polishing process requires the polishing cloth to be matched to the process surface that is to be machined.

The quality of a polishing process can be measured according to a number of defects and defect surface area (defect density) of the working surface based on a reference surface.

A defect in the fully polished working surface is any notch with a depth, i.e. a vertical extent, orthogonal to the working surface, into the working layer that goes beyond the residual roughness that is to be achieved by the polishing process.

The dimensions of such defects can be increased in subsequent material-removing process steps, for example etching operations.

The causes of defects in FA polishing processes are relatively large particles rolling along the process surface in a space between the process surface and a section of the polishing cloth which otherwise rests on the process surface. In such an event, the rolling particle leaves a track of imprints on the process surface.

Such particles may be fragments of the abraded material, oversized abrasive particles, agglomerates from the carrier material, impurities that have been released from the polishing cloth in the same way as the abrasive particles from the polishing cloth or other impurities.

Defects are also produced as a result of relatively large structures breaking out of the process layer, the structures being broken out in sufficient amounts to reach the working layer.

The defect density and the need to match the polishing cloth to the process surface increase with an aspect ratio (depth:width) of sections which are to be filled and in some cases only become obvious at relatively high aspect ratios.

Structures with such aspect ratios (high aspect ratio (HAR) structures) as required in vertical cell technology are usually filled in a plurality of deposition steps (HAR fill), with additional material-removing processes preventing recessed sections of the working layer from being closed up (covered over) before they have been completely filled. A process sequence of this type forms a sequence of high density plasma (HDP) deposition processes and etching processes (HDP/etch/HDP process).

During abrasion of a relief that has formed in the process layer as a result of a sequence of HDP and etching processes, it is necessary to match the toughness of the carrier material of the polishing cloth, since this relief has a particularly high aggressiveness on account of its high vertical extent and fine structuring.

Such matching may be carried out, for example, by a two-stage process, the relief being abraded by preliminary planarization using a polishing cloth with a hard carrier material, and the overfill being abraded in a subsequent polishing process using a polishing cloth with a soft carrier material, and the working surface being planarized. Preliminary planarization generally requires an undesirable change in the polishing device.

Since the process surfaces of wafers that differ in terms of configuration and technology have a different aggressiveness with respect to the carrier material of the polishing cloth, the installations that are required for polishing either always have to be equipped with adapted polishing cloths or have to be assigned to the particular wafers.

To summarize, a polishing process of conventional type is inadequate for abrading a process layer that originates from HAR fill and for planarizing a working layer that is uncovered in the process with regard to the now described aspects. A defect density in the planarized working layer is higher than in process layers which do not originate from HAR fill, and the polishing device has to be matched to the properties of the process surface and therefore to the wafer.

SUMMARY OF THE INVENTION

It is accordingly an object of the invention to provide a defect-minimizing, topology-independent planarization of process surfaces in semiconductor devices that overcomes the above-mentioned disadvantages of the prior art methods of this general type, in which process such process layers can be machined using the same abrading devices and the same procedure and the defect density of a working surface which has been uncovered and planarized by the process is reduced.

With the foregoing and other objects in view there is provided, in accordance with the invention, a process for treating a process layer applied to a working surface of a semiconductor device. The process layer has a structure formed of recessed sections and elevated sections. The method includes applying an auxiliary substance to the process layer resulting in the recessed sections being at least partially filled with the auxiliary substance and a filled process layer being formed, and reducing in height the filled process layer down to the working surface, using a polishing device, resulting in the working surface being planarized.

Therefore, according to the process according to the invention, in a first step, an auxiliary substance is applied to the process layer which is to be abraded and has been structured by a relief with recessed and elevated sections. The recessed sections of the relief in the process layer are at least partially filled with the auxiliary substance. The filling preferably, though not necessarily, takes place as far as a base surface of the recessed sections of the process layer.

In a second step, the process layer is abraded and a working surface uncovered and the working surface planarized in each case using the same polishing device.

Since a maximum aggressiveness of the process surface is determined essentially by the vertical extent of uncovered edges of the relief, and the edge height is reduced in a filled process layer, the extent of the aggressiveness of the process surface during the abrasion of the process layer is also reduced.

If the process material and the auxiliary material are, for example, resistant to the abrading process in the same way, the process surface remains uniformly smoothed throughout the entire abrading (polishing) process.

There is no need for preliminary planarization.

Furthermore, the abrading (polishing) process can be carried out using the same polishing device in the same way for different wafers with different configurations made using different technologies.

The procedure involved in the abrading process is simplified by a stop layer made from a material that is resistant to the abrading process, the stop layer limiting the advance of the abrading process. A stop layer of this type is applied in sections to elevated sections of the relief of the working layer.

The working surface is then formed in sections by the surfaces, which lie opposite the working layer, of the sections of the stop layer.

It is preferable for the auxiliary substance to be selected and applied in such a way that elevated sections (structures) of the process layer are stabilized. This reduces the likelihood of structures of this type being torn out and of relatively large fragments of the structures being abraded, compared to a conventional process. Moreover, the reduced vertical extent of the relief that has been smoothed by the fill reduces the likelihood of relatively large agglomerates breaking out of the carrier material of the polishing cloth.

Overall, therefore, the at least partial elimination of the mechanisms that cause defects reduces the defect density on the working surface.

If an auxiliary substance which is less resistance to the polishing process than the process material is selected, it is the auxiliary substance that is abraded first.

If, moreover, the auxiliary substance is soluble in the process liquid, the edges of the relief are uncovered from the process material to a process height, i.e. a vertical extent perpendicular to the working surface, during the abrading process. The process height is dependent on the difference in the resistance to the abrading process of the auxiliary substance and of the process material. Since the process height determines the aggressiveness of the process surface, the abrading process can be influenced and adapted by the process height.

By way of example, process surfaces can be made uniform in terms of their polishing characteristics on wafers that differ in terms of configuration and technology by using auxiliary substances of different resistance.

All readily polishable materials that are customary in semiconductor process technology and can be used to fill the recessed sections of the process layer can be used as the auxiliary substance. The auxiliary substance preferably belongs to a group containing spin-on glass, organic polymers, doped silicon and silicones.

The auxiliary substance can be applied by conventional deposition processes. It is preferable for the auxiliary substance to be applied using a spin-on process, by which recessed sections of the process layer can be satisfactorily filled.

The abrasion of the process layer can be combined with different types of CMP processes. The polishing process that is preferred for the process according to the invention is an FA polishing process. Multi-step polishing processes, in which individual steps may also be carried out as a standard slurry process, are also conceivable.

The advantages of the process according to the invention come to bear in particular in vertical cell technology, in which process layers which originate from a HAR fill process are abraded, it being possible for the HAR fill process to include a sequence of HDP/etch/HDP processes.

Other features which are considered as characteristic for the invention are set forth in the appended claims.

Although the invention is illustrated and described herein as embodied in a defect-minimizing, topology-independent planarization of process surfaces in semiconductor devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
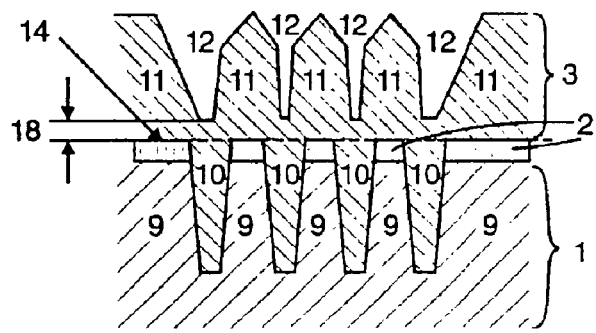
FIGS. 1A–1D are diagrammatic, sectional views through part of a semiconductor device in a plane that is orthogonal to a working surface and shows a defect-reducing mechanism and related process steps according to the invention.

Referring now to the figures of the drawing in detail and first, particularly, to FIGS. 1A–1D thereof, there is shown a defect-reducing mechanism of a process according to the invention on the basis of an example. The example illustrates a fixed abrasive (FA) polishing process carried out on a process layer 3 that has a high aspect ratio fill and is structured in the form of a relief, in four phases.

FIG. 1A shows a working layer 1 that has been applied to a wafer and structured in the form of a relief. The relief has high aspect ratio (HAR) structures with elevated and recessed sections 9, 10, as typically occur in vertical cell technology.

Sections of a stop layer 2 in each case rest on the elevated sections 9. Surfaces of the stop layer 2 that are in each case on the opposite side from the working layer 1 form sections of a working surface 14 which they define, at which a polishing process ends and which is uncovered and planarized by the polishing process. The material of the stop layer 2 is resistant to the polishing process.

During the filling of the recessed sections 10 of the HAR structure of the working layer 1 by a process material by an HDP/etch/HDP process (HDP=high density plasma), the process layer 3 that is structured in the form of the relief and has the elevated sections 11 and the recessed sections 12 is formed.

The distance between the working surface 14 and a base surface of the recessed sections 12 of the process layer 3 forms an overfill 18.

Figure 1B:
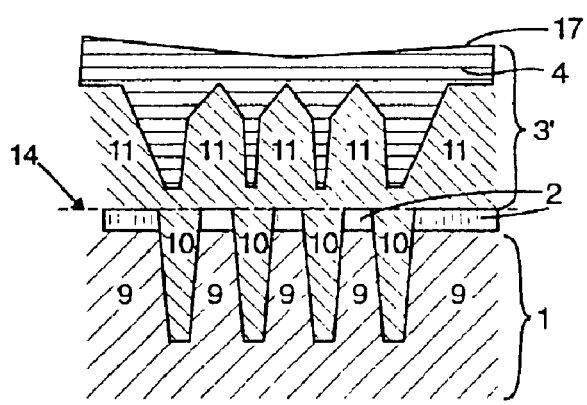

In FIG. 1B, an auxiliary substance 4 is applied to the process layer 3. In this example, the auxiliary substance 4 completely fills the recessed sections 12 of the process layer 3' that has now been filled. The auxiliary substance 4 forms a smoothed process surface 17 that is on the opposite side from the working layer 1 and has an only weakly pronounced structure that is of no relevance to a polishing process.

Figure 1C:
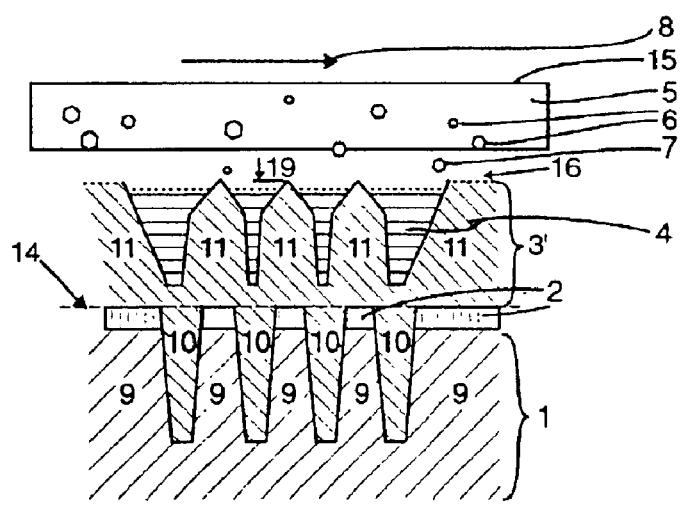

FIG. 1C illustrates a stage of the FA polishing process. The wafer and a polishing cloth 15 are moved with respect to one another in a polishing plane parallel to the working surface 14, for example also in a polishing direction 8. On the wafer, a process surface 16 that changes constantly as a result of the abrasion of the process material 3 of the process layer 3' and of the auxiliary substance 4 lies opposite the polishing cloth 15.

During the abrasion of the process layer 3', the process surface 16 is formed in sections by the auxiliary substance 4 and in sections by the uncovered process material.

During the polishing process, abrasive particles 6 which are embedded in a carrier material 5 are released. Abrasive particles 7, which have been completely or partially released, abrade the process layer 3' down to the working surface 14.

The auxiliary substance 4, which is softer than the process material, is abraded more quickly by the completely or partially released abrasive particles 7 than the process material. The elevated sections (structures) 11 which have been formed from the process material are uncovered at most to a process height 19 which can be determined by the procedure.

The elevated sections (structures) 11 of the process layer 3 are stabilized by filling them with the auxiliary substance 4. This reduces the likelihood of the structures 11 being torn out and of larger fragments of the structures 11 being abraded compared to a conventional process. Moreover, the lower process height 19 of the relief that has been smoothed by the filling reduces the likelihood of relatively large agglomerates being torn out of the carrier material 5 of the polishing cloth.

Figure 1D:
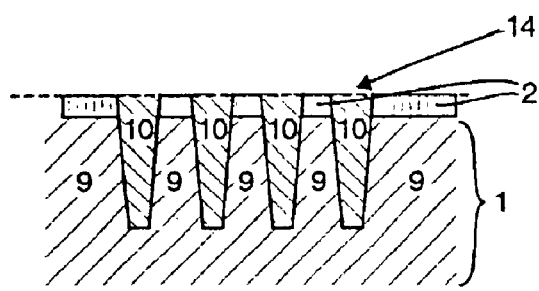

FIG. 1D shows the end state of the polishing (abrading) process, the uncovered and planarized working surface 14, formed in sections from the material of the stop layer 2 and in sections from the process material in the filled, recessed sections 10 of the working layer 1.

Figure 2A:
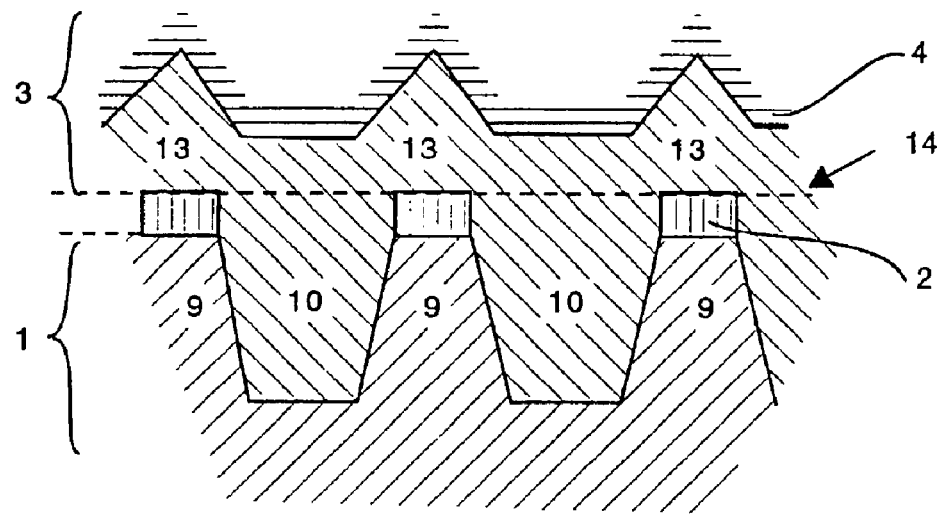
FIGS. 2A–2B are sectional views depicting the process, according to the invention, through part of the semiconductor device in a plane which is orthogonal to the working surface.
Figure 2B:
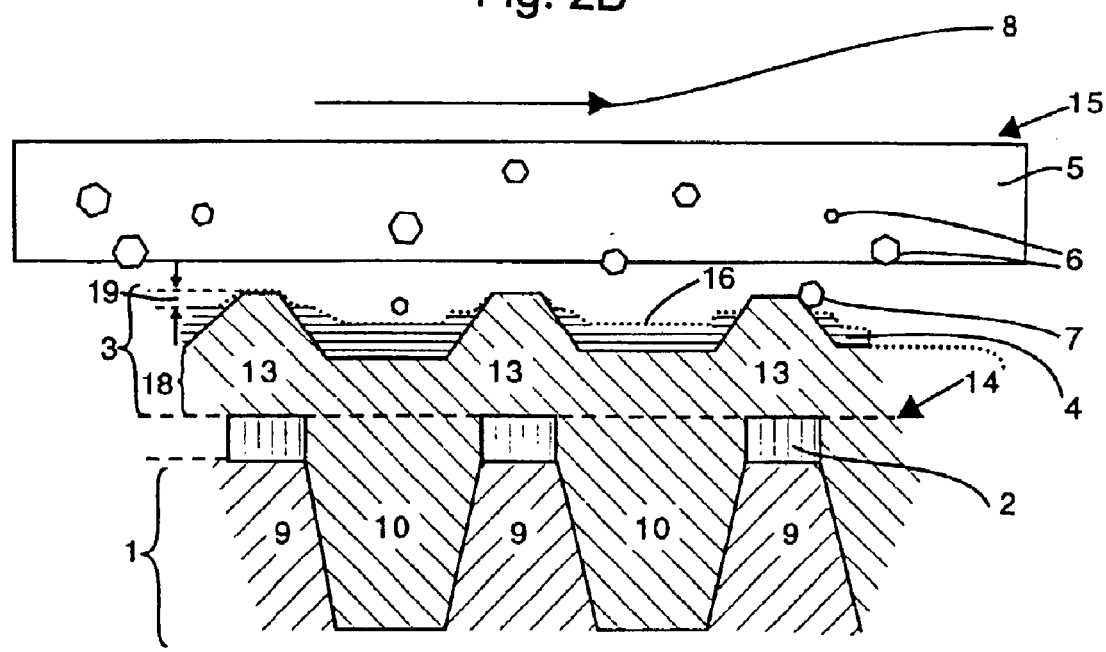

FIGS. 2A and 2B diagrammatically depict the mechanism of the process according to the invention which adjusts a polishing process with reference to the example of a FA polishing process on the process layer 3 which has an emphasis typical of current technologies and has been formed by filling the recessed sections 10 of the working layer 1 which has been structured in the form of a relief.

FIG. 2A shows the working layer 1 that has been structured in the form of a relief and has the elevated and recessed sections 9, 10. In each case parts of the stop layer 2 rest on the elevated sections 9. Surfaces of the stop layer 2 that in each case lie on the opposite side from the working layer 1 form sections of the working surface 14 which they define, at which a polishing process ends and which is uncovered by the polishing process.

During application of the process layer 3, the recessed sections 10 of the working layer 1 are filled with a process material. In the process, in conventional technologies, shallow, inclined elevations 13 (hats) with a triangular cross section are formed from the process material above the elevated sections 9 of the working layer 1.

The auxiliary substance 4, which in the present example uniformly covers the shallow structures of the process layer 3, has been deposited on the process layer 3.

FIG. 2B illustrates the polishing process during which the wafer and the polishing cloth 15 are moved with respect to one another in a polishing plane parallel to the working surface 14, inter alia also in the polishing direction 8. On the wafer, tje process surface 16 that changes constantly as a result of the abrasion of the process layer material and the auxiliary substance 4 lies opposite the polishing cloth 15.

During the abrasion of a section of the process layer 3 which is disposed above the overfill 18, the process surface 16 is formed in sections from the auxiliary substance 4 and in sections from the uncovered process material.

The auxiliary substance 4 is soft compared to the process material and is abraded first, the process material which builds the structures being uncovered at most to an extent which results from the different hardness of the process material and the auxiliary substance 4 and further process conditions, for example the plastic deformability of sections of the polishing cloth 15 which rest on the process surface 16.

The process height 19 together with the number of edge lengths of the process surface 16 determines the aggressiveness of the process surface.

The process height 19 can be selected, for example, by choosing the process material or its density and can be matched to a configuration on the wafer or a technology used to form the configuration on the wafer.

Figure 3:
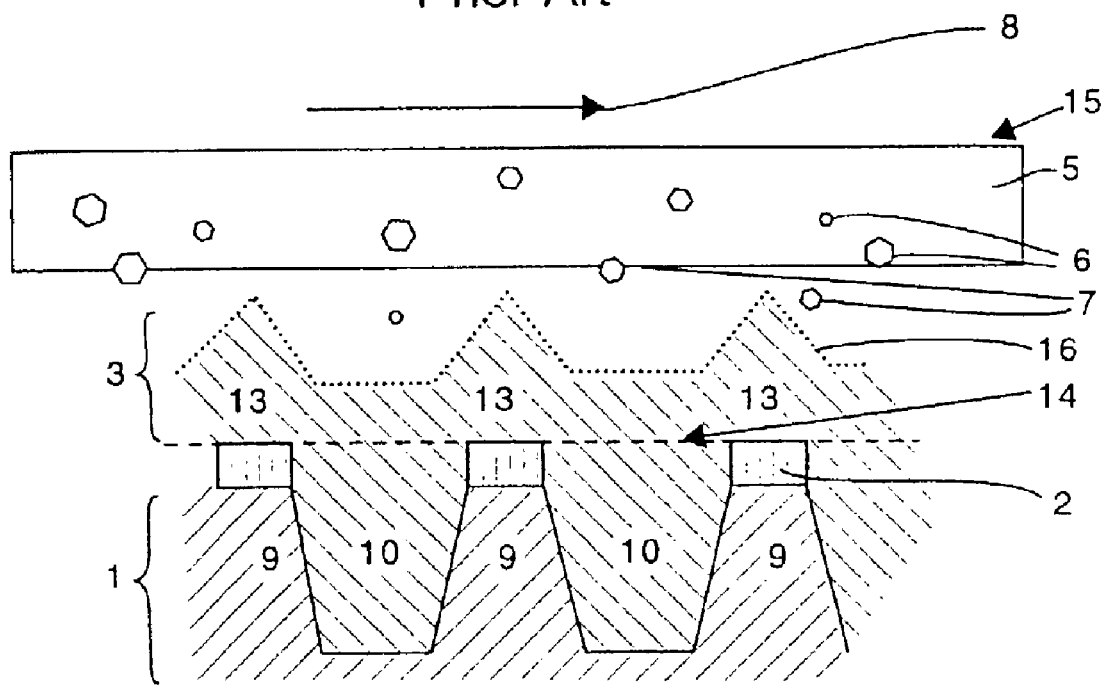
FIG. 3 is a sectional view depicting a conventional process on the basis of a cross section through part of a semiconductor device in a plane that is orthogonal to the working surface.

FIG. 3 diagrammatically depicts a conventional FA polishing process with which the process layer 3, which has an emphasis typical of current technologies and has been formed by filling the recessed sections 10 of the working layer 1 which has been structured in the form of a relief, is abraded down to the working surface 14 and, at the same time, the working surface 14 is planarized.

FIG. 3 shows the working layer 1 which has been structured in the form of the relief and has the elevated and recessed sections 9, 10. In each case sections of the stop layer 2 rest on the elevated sections 9. Surfaces of the stop layer 2 that are in each case on the opposite side from the working layer 1 form sections of the working surface 14 which they define, at which a polishing process ends and which is uncovered by the polishing process.

During the application of the process layer 3, the recessed sections 10 of the working layer 1 are filled with a process material. In the process, in conventional technologies, shallow, inclined elevations (hats) 13 with a triangular cross section are formed from the process material above the elevated sections 9 of the working layer 1.

During the polishing process, the wafer and the polishing cloth 15 are moved with respect to one another in a polishing plane parallel to the working surface 14, for example in the polishing direction 8. On the wafer, the process surface 16 that changes constantly as a result of the abrasion of the process material lies opposite the polishing cloth 15.

During the polishing process, the abrasive particles 6 which are embedded in the carrier material 5 are released. The abrasive particles 7, which have been completely or partially released, abrade the process material down to the working surface 14.

The inclined elevations 13 of the process layer 3 have a vertical extent perpendicular to the working surface 14 which is significantly less than that of structures which originate from HAR fill and also have shallower angles, which are therefore less aggressive with respect to the carrier material 5.

Overall, the influence of a structure as illustrated in FIG. 3 on the polishing result, even in finely structured regions of the process layer 3 of this type, remains significantly less than that of a structure originating from HAR fill.

In polishing processes which take place on such process layers 3, the abrasive particles 6 are released with a uniform distribution over the process surface 16 irrespective of the degree of structuring (fine, coarse) of this surface, the configuration (logic, memory) produced on the wafer or the technology employed (180 nm, 150 nm).

The shallow elevations 13 are stable with respect to relatively large fragments breaking out or with respect to being completely torn out of the process layer 3. On account of the low aggressiveness, relatively large agglomerates only flake out of the carrier material to a slight extent.

The working surface 14 which has been formed from the process layer 3 structured in this manner by a polishing process consequently has a significantly lower defect density than the working surface 14 which is produced using the same polishing process on the process layer 3 which originates from HAR fill.

We claim:

1. A process for filling high aspect ratio structures of a working layer, which comprises the steps of:
    filling the high aspect ratio structures by forming a process layer using a process sequence including a high density plasma process, an etching process, and another high density plasma process, thus forming the process layer having a structure formed of recessed sections and elevated sections;
    applying an auxiliary substance to the process layer resulting in the recessed sections being at least partially filled with the auxiliary substance and a filled process layer being formed; and
    reducing in height the filled process layer down to a working surface formed in sections by upper edges of the high aspect ratio structures, using a polishing device, resulting in the working surface being planarized.

2. The process according to claim 1, which comprises forming the working surface to be sections of surfaces of a stop layer oriented with respect to the process layer.

3. The process according to claim 1, which comprises filling the recessed sections with the auxiliary substance such that the elevated sections are reinforced against shear forces that occur in the reducing step.

4. The process according to claim 1, which comprises:
    using a polishing process for reducing the height of the filled process layer;
    selecting the auxiliary substance such that the auxiliary substance has a lower resistance to the polishing process than a process material forming the elevated sections.

5. The process according to claim 4, which comprises selecting the auxiliary substance such that a resistance of the auxiliary substance is adjustable.

6. The process according to claim 5, which comprises adjusting the resistance of the auxiliary substance in dependence on a topology of the process layer such that the polishing of the filled process layer and the resultant planarization of the working surface are carried out using the polishing device and a same procedure for the different topologies of the structure.

7. The process according to claim 1, which comprises selecting the auxiliary substance from the group consisting of spin-on glass, organic polymers, doped silicon and silicones.

8. The process according to claim 1, which comprises depositing the auxiliary substance using a process selected from the group consisting of a spin-on process and a chemical vapor deposition process.

9. The process according to claim 1, which comprises carrying out the reducing of the height of the filled process layer step and the planarization of the working surface by a fixed abrasive polishing process.

10. The process according to claim 1, which comprises selecting the auxiliary substance such that the auxiliary substance is soluble in a process liquid applied during the reducing step.

11. The process according to claim 10, which comprises selecting the auxiliary substance such that a solubility of the auxiliary substance is adjustable.

12. A process for filling high aspect ratio structures of a working layer, which comprises the steps of:
    filling the high aspect ratio structures by forming a process layer using a process sequence including a high density plasma process, an etching process, and another high density plasma process, thus forming the process layer having a structure formed of recessed sections and elevated sections;
    applying an auxiliary substance to the process layer resulting in the recessed sections being at least partially filled with the auxiliary substance and a filled process layer being formed, a resistance of the auxiliary substance being adjusted in dependence on a topology of the process layer; and
    reducing in height the filled process layer down to a working surface formed in sections by upper edges of the high aspect ratio structures using a polishing device resulting in the working surface being simultaneously planarized via the polishing device and a same procedure for different topologies of the structure.

13. The process according to claim 12, which comprises forming the working surface to be sections of surfaces of a stop layer oriented with respect to the process layer.

14. The process according to claim 12, which comprises filling the recessed sections with the auxiliary substance such that the elevated sections are reinforced against shear forces that occur in the reducing step.

15. The process according to claim 12, which comprises selecting the auxiliary substance such that the auxiliary substance has a lower resistance to the reducing step than a process material forming the structure.

16. The process according to claim 12, which comprises selecting the auxiliary substance such that the auxiliary substance is soluble in a process liquid applied used in the reducing step.

17. The process according to claim 12, which comprises selecting the auxiliary substance from the group consisting of spin-on glass, organic polymers, doped silicon and silicones.

18. The process according to claim 12, which comprises depositing the auxiliary substance using a process selected from the group consisting of a spin-on process and a chemical vapor deposition process.

19. The process according to claim 12, which comprises using a fixed abrasive polishing process for performing the reducing in height of the filled process layer step and the resultant planarization of the working surface.

* * * * *